United States Patent [19]
Ishak et al.

[11] Patent Number: 4,652,338
[45] Date of Patent: Mar. 24, 1987

[54] MAGNETOSTATIC WAVE RESONATOR CAPABLE OF BATCH PROCESSING

[75] Inventors: Waguih Ishak, Cupertino; Kok W. Chang, Sunnyvale, both of Calif.

[73] Assignee: Hewlett-Packard Company, Palo Alto, Calif.

[21] Appl. No.: 840,846

[22] Filed: Mar. 18, 1986

[51] Int. Cl.$^4$ .......................... C23F 1/02; B44C 1/22; C03C 15/00
[52] U.S. Cl. ................................ 156/659.1; 156/656; 156/661.1; 156/664
[58] Field of Search ..................... 156/652, 656, 659.1, 156/661.1, 664, 901, 902; 333/219

[56] References Cited

U.S. PATENT DOCUMENTS 4,528,529 7/1985 Huijer .................................. 333/219

Primary Examiner—William A. Powell
Attorney, Agent, or Firm—John A. Frazzini

[57] ABSTRACT

In a batch process of manufacturing magnetostatic resonators, photolithographically etching a ferrimagnetic layer, that has been deposited on a dielectric substrate, to produce a plurality of disjoint blocks of ferrimagnetic material. Each block has a pair of sides that are substantially parallel for use in reflecting magnetostatic waves to form a resonator. A conductive layer is deposited on the wafer and then this layer is photolithographically etched to form a transducer adjacent to each of these reflecting sides.

4 Claims, 4 Drawing Figures

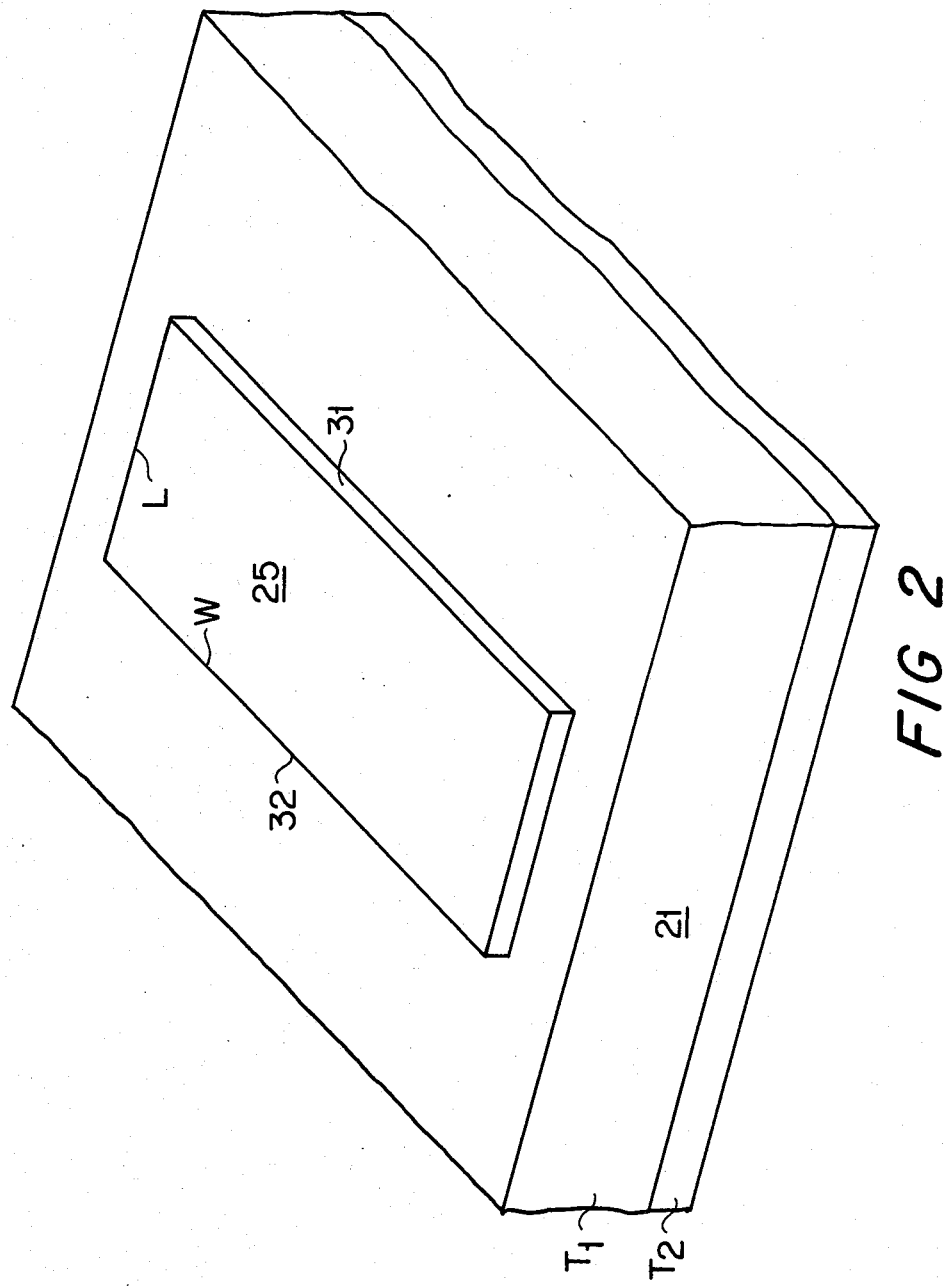

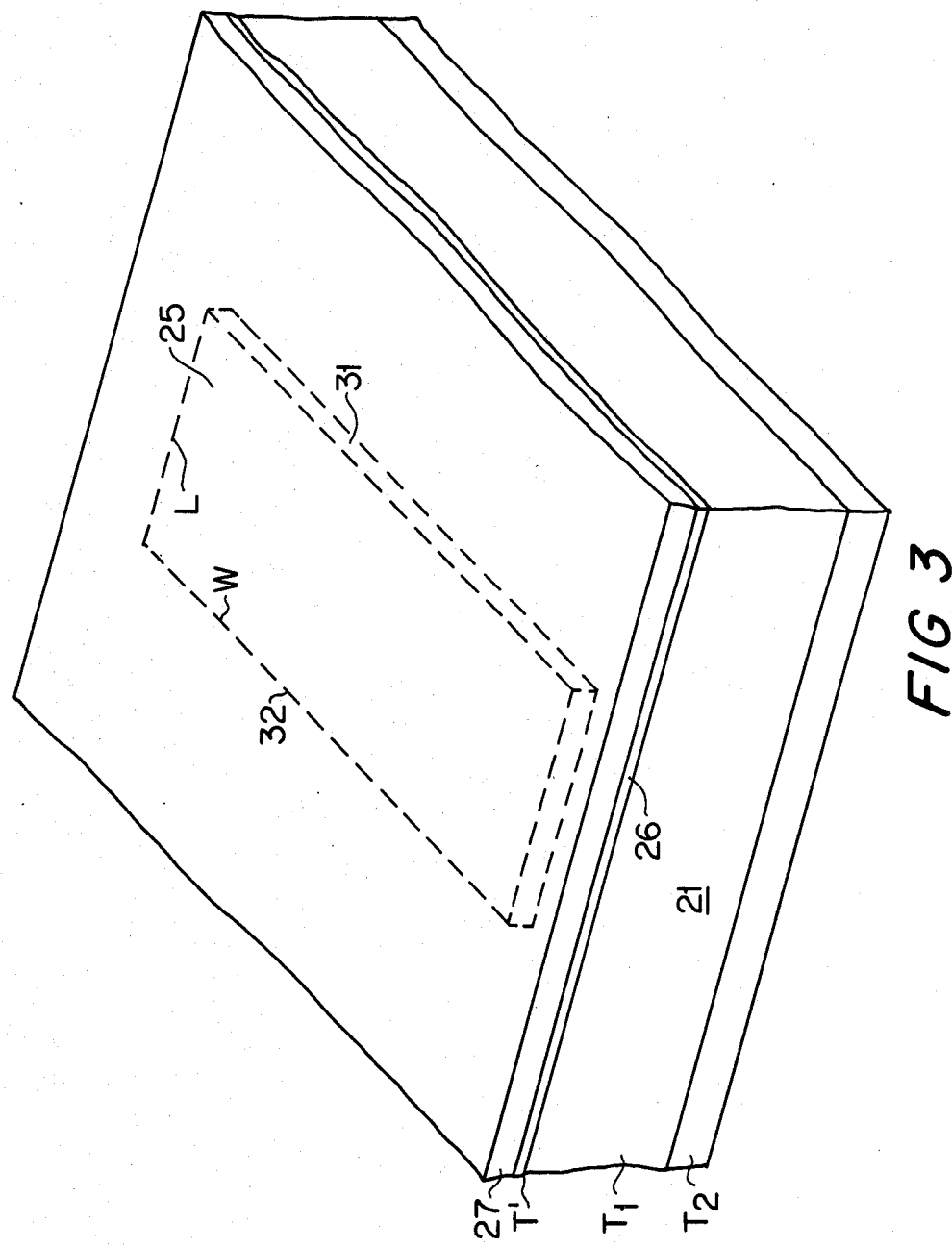

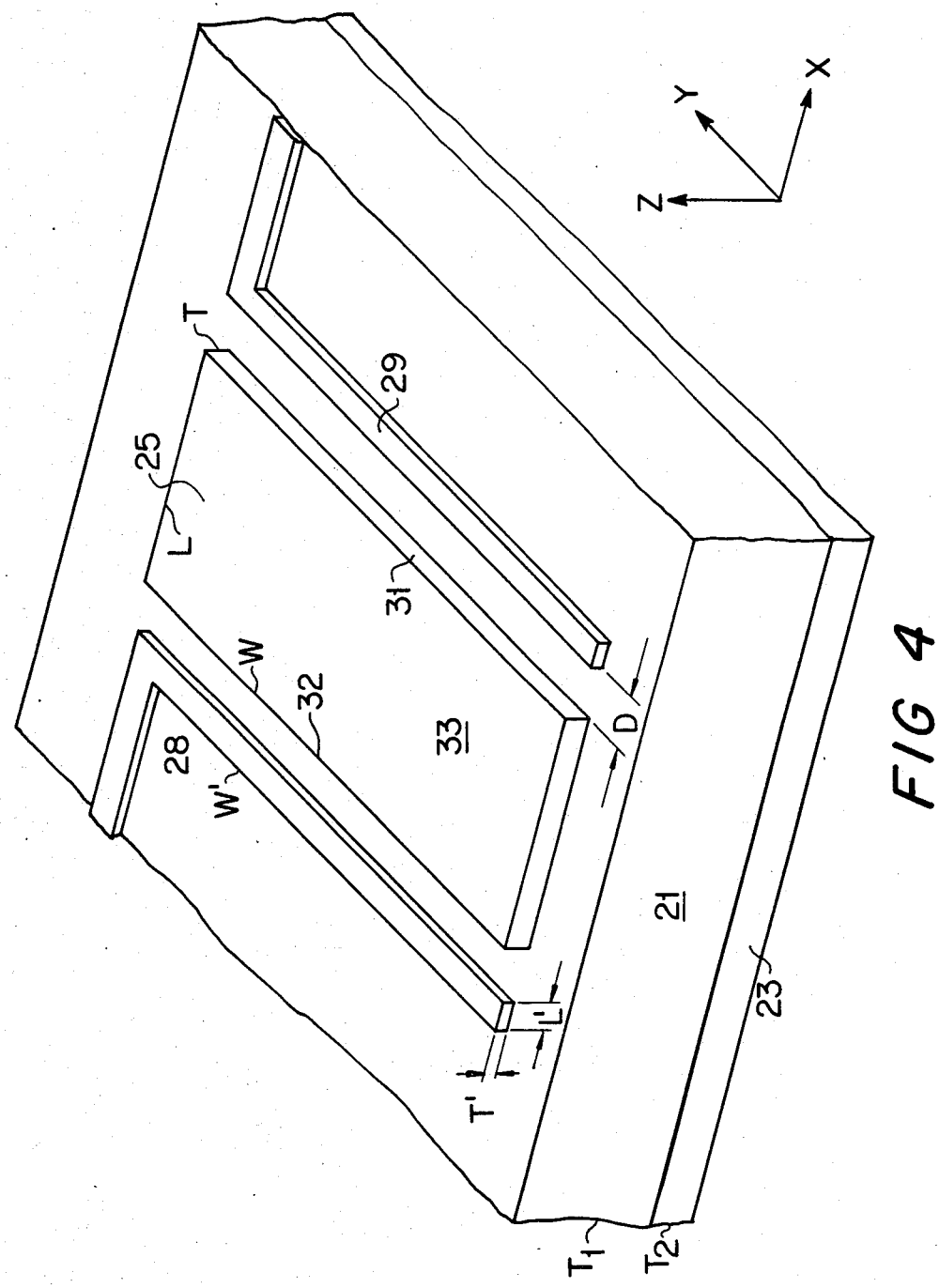

MAGNETOSTATIC WAVE RESONATOR CAPABLE OF BATCH PROCESSING

BACKGROUND OF THE INVENTION

This invention relates in general to magnetostatic wave resonators and relates more particularly to a method of manufacture that makes this resonator have improved properties and makes it suitable for batch processing. In prior devices, yttrium iron garnet (YIG) spheres and slabs have been used as resonators (See, for example, the articles J. D. Adam "Delay of Magnetostatic Surface Waves in Y.I.G. Slab", *Electronics Letters*, Vol. 6, No. 22 (1970) directed to resonance of YIG slabs; and J. P. Castera et al, "Magnetostatic Wave Resonators", *Proc. of* 1981 *RADC*, 218–228 (1981) directed to YIG thin film devices). In these devices, a pair of complex array reflectors are formed on the YIG film to reflect the magnetostatic waves generated in the film. These reflectors functionally act like the walls of a resonant cavity. This type of resonator requires a complex fabrication procedure and also exhibits a relatively high insertion loss and low Q.

In U.S. Pat. No. 4,528,529 entitled MAGNETOSTATIC WAVE RESONATORS, issued on July 9, 1985 to Ernst Huijer, another thin YIG film resonator is presented. In this resonator, a wafer saw is used to cut a thin block of YIG from a thin YIG film. Two sides of the block are substantially parallel so that the block acts as a resonator for magnetostatic waves reflecting between these two sides of the block. A pair of parallel microstrip transducers are formed on a substrate for use in coupling energy into and out of the block. The YIG block is then attached to the substrate in between these transducers by a nonconducting adhesive such as RTV manufactured by Dow. A microscope is used to assist in aligning the sides of the YIG block parallel to and midway between the parallel microstrip transducers. Such resonators can exhibit extremely high Q's and when their dimensions are optimized, can exhibit very low loss ($\leq 10$ dB) over a very wide tuning range from 1–22 GHz (see the article K. W. Chang and W. Ishak, "Magnetostatic Forward Volume Wave Straight Edge Resonators", to appear in Proc. of IEEE-MTT Symposium, 1986). In order to suppress spurious modes, it is essential that the two sides that reflect the magnetostatic waves be parallel to a high degree of accuracy. This is a critical step and requires a very careful alignment procedure during the cutting operation and usually requires a technician to precisely align the saw relative to the film. This results in a time consuming procedure that is inherently variable in quality. It also requires that each of the block be cut individually. The formation of the two parallel sides by use of a saw usually produces chipping of these sides, resulting in performance degradation. It would be advantageous to have a resonator manufacturing process that produces a large number of blocks in a single iteration of the process, that produces flat reflective sides and that does not require human input in the critical steps of forming the two parallel sides and aligning transducers parallel to them.

SUMMARY OF THE INVENTION

In accordance with the illustrated preferred embodiment of the invention, a YIG film, grown on a dielectric substrate such as Gadolinium Gallium Garnet (GGG), is covered by a photoresist that is photographically exposed and developed to form a plurality of rectangles, each having two sides that are parallel to a high degree of accuracy. The YIG film is chemically etched or ion milled to form a plurality of block, each having two substantially parallel sides. The photoresist layer is then removed.

A layer of a conductive material is deposited over the block and substrate and then a second photoresist layer is deposited over this conductive layer. The second photoresist layer is photographically exposed and developed to form a thin strip of photoresist adjacent to and parallel to each of the two parallel sides of the block. The conductive layer is chemically etched or ion milled to form a conductive transducer adjacent to each of the two parallel sides of the YIG block. The second photoresist layer is then removed and the substrate is sawed to separate the identical resonators produced concurrently by this batch process. A conductive ground plane is also typically formed on the side of the substrate opposite to that on which the block of YIG film is deposited. This ground plane is easily produced any time previous to sawing the substrate to separate the individual resonators.

One of the transducers functions as an input transducer to induce magnetostatic waves in the resonator and the other transducer functions as an output transducer that senses the magnetostatic waves produced in the resonator. When the applied bias field is in the plane of the YIG film, resonance occurs when $(k_+ + k_-)L = 2n$ times pi, where L is the distance between the parallel sides of the resonator, n is an integer, $k_+$ is the wavenumber of a wave for one direction of travel on the top surface of the YIG block between the two parallel sides of the resonator and $k_-$ is the wavenumber for the opposite direction of travel on the bottom surface of the YIG block. When the applied field is normal to the YIG film plane, resonance occurs when $kL = 2n$ time pi, where k is the wavenumber of the magnetostatic forward volume wave.

The production of the blocks of YIG material by photolithographic processing enables the two substantially parallel sides to be parallel to a greater degree of accuracy than in the resonator presented in the patent by Huijer discussed above in the Background of the Invention. Photolithographic processing also enables these parallel sides to be free of chipping and enables the transducers to be formed much closer to the block of YIG film, thereby reducing the insertion loss compared to the device presented by Huijer. Insertion loss is defined to be $20^*\log [V_{out}/V_{in}]$ where $V_{in}$ is the voltage applied to the input transducer and $V_{out}$ is the resulting voltage produced in the output transducer.

DESCRIPTION OF THE FIGURES

FIGS. 1–3 present three stages of a batch process suitable for production of a magnetostatic wave resonator.

FIG. 4 shows a magnetostatic wave resonator produced by the process that is illustrated in FIGS. 1–3.

DESCRIPTION OF THE PREFERRED EMBODIMENT

Figure 1:
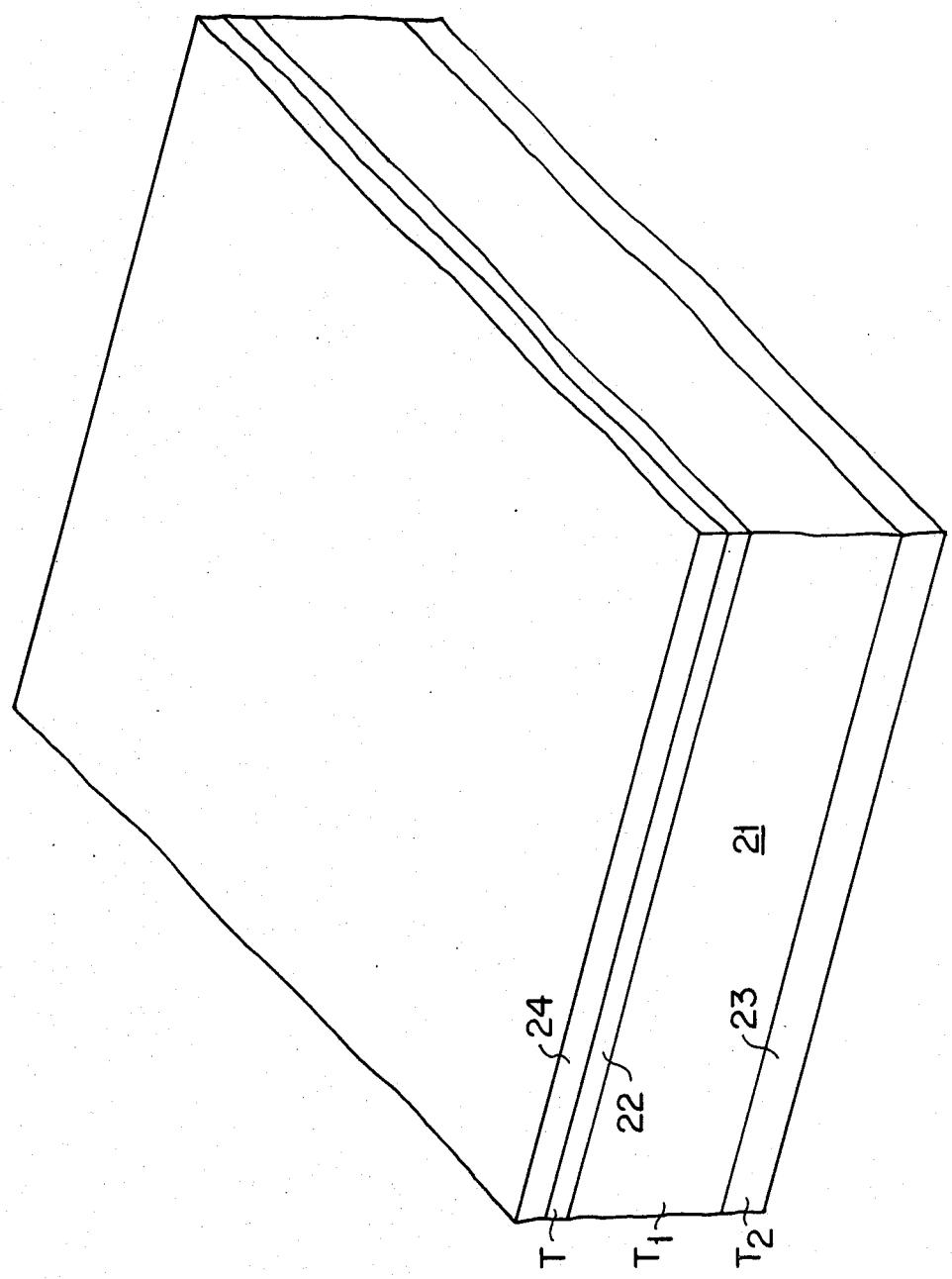

In FIG. 1 are illustrated the initial steps in a magnetostatic wave resonator batch manufacturing process. In accordance with this process, a wafer having a layer 22 of ferrimagnetic material such as Yttrium Iron Garnet (YIG) on a dielectric substrate 21 such as Gadolinium Gallium Garnet (GGG) is processed to produce a large number of rectangular YIG blocks in a single iteration of the process. Yttrium Iron Garnet has been found to be a particularly suitable material for use in magnetostatic wave devices. Gadolinium Gallium Garnet is typically used as the substrate because its lattice matches the lattice of Yttrium Iron Garnet. Ferrimagnetic layer 22 can be formed on dielectric substrate 21 by any of a number of techniques including sputtering, epitaxial growth and chemical vapor deposition. Alternatively, dielectric substrates covered by a thin ferrimagnetic material can be purchased commercially. Ferrimagnetic layer 22 has a thickness T typically in the range from 5-200 microns. Substrate layer 21 has a thickness $T_1$ typically in the range 125-1,000 microns.

On the side of the substrate opposite to the ferrimagnetic layer, a layer 23 of a conductive material, such as aluminum, is formed to function as a ground plane for the resonator. This conductive layer can be deposited by a number of well known techniques including sputtering and chemical vapor deposition. The thickness $T_2$ of this conductive layer is typically in the range 2-20 microns.

The top surface of ferrimagnetic layer 22 is covered with a layer 24 of photoresist such as AZ 1470 positive photoresist manufactured by Shipley Company, Inc. Resist layer 24 is exposed through a first mask having an array of rectangular opaque areas and then the resist is developed to leave an array of rectangular areas of hardened photoresist. The wafer is then placed in a hot (250-300 degrees Centigrade) bath of phosphoric or hydrofluoric acid to etch away the exposed portions of YIG layer 22. The etch rate is on the order of 1 micron per minute. The wafer is then rinsed in deionized water, is cleaned with acetone or isopropyl alcohol and then is blown dry. Alternatively, instead of chemically etching layer 22, this layer can be ion milled in a vacuum system in which argon ions are accelerated at the wafer to etch away the exposed regions of layer 22. By either of these etching processes, an array of rectangular blocks 25 (see FIG. 2 in which is shown a portion of the wafer on which a single block has been formed) of YIG film are produced on substrate 21. These blocks typically have a width W in the range 3-4 millimeters and a length L in the range 0.8-1.2 millimeters. Sides 31 and 32 of block 25 are parallel to a high degree of accuracy and are used to reflect the magnetostatic waves to form a resonator cavity.

In the next steps, illustrated in FIG. 3, a layer 26 of conductive material such as gold, aluminum, silver or chromium-gold alloy, is deposited on top of blocks 25 and the exposed portions of substrate 21. This layer will be patterned to produce a microstrip transducer adjacent to and parallel to each of sides 31 and 32 for each of blocks 25. The thickness T' of this conductive layer is typically in the range 3-6 microns. Layer 26 is then covered by a second resist layer 27 that is exposed through a second mask having a pattern suitable for producing the microstrip transducers. Resist layer 27 is developed and then the wafer is placed in a bath suitable for etching conductive layer 26. Microstrip transducers 28 and 29 (shown in FIG. 4) are thereby produced adjacent to each of blocks 25. Suitable baths to etch layer 26 for each choice of conductive material are well known. The wafer is then rinsed in deionized water, is cleaned in acetone or isopropyl alchohol and is then blown dry. The length L' is 30-250 microns and the width W' is typically equal or comparable to the width W of block 25.

Production of the microstrips and the blocks by photolithographic process steps enables the microstrips to be aligned to the sides 31 and 32 within 0.2 degrees accuracy and enables the distance D between the transducers and the sides 31 and 32 of the blocks to be only a few microns. This reduces the insertion loss of this resonator compared to the resonator presented in the patent by Huijer. The high degree of parallelism of sides 31 and 32 also reduces spurious modes that arise for waves that do not move perpendicular to sides 31 and 32.

A wafer saw is used to cut the wafer into separate resonators. A tunable resonator can be produced by placing one of these resonators in an adjustable magnetic field. When the field is in the X-direction, perpendicular to reflecting sides 31 and 32, magnetostatic backward volume waves are produced in the resonator cavity. When the field is in the Y-direction, parallel to sides 31 and 32 and also parallel to the top surface 33 of block 25, then magnetostatic surface waves are produced in the resonator cavity. When the field is in the Z-direction, perpendicular to surface 33 of block 25, then magnetostatic forward volume waves are produced in the resonator.

In this method, it is not essential in which order the conductive ground plane, the ferrimagnetic blocks and the microstrip transducers are produced. For example, the ground plane could be formed on the back of the wafer after both the ferrimagnetic blocks and microstrip transducers are formed. Similarly, the microstrip transducers could be produced before the ferrimagnetic blocks are formed. In any of these cases, the use of photolithographic processing enables production of the resonators in batches and also enables highly precise parallelism to be produced between the reflective sides of the ferrimagnetic blocks and also between a reflective side and its associated microstrip transducer.

What is claimed is:

1. A method of manufacturing a plurality of magnetostatic resonators from a wafer having a dielectric substrate, on one side of which a layer of ferrimagnetic material has been deposited, said method comprising the steps of:
   (a) photolithographically etching the ferrimagnetic layer to produce a plurality of disjoint blocks of ferrimagnetic material, each block having a pair of sides that are substantially parallel;
   (b) forming on the wafer a layer of conductive material; and
   (c) photolithographically etching the layer of conductive material to produce a microstrip transducer adjacent to and substantially parallel to each side of said pair of parallel sides for each block of ferrimagnetic material.

2. A method as in claim 1 further comprising the step of:
   (d) forming a conductive layer of material on the side of the wafer opposite to the side on which the blocks of ferrimagnetic material have been formed.

3. A method of manufacturing a plurality of magnetostatic resonators from a dielectric substrate wafer, said method comprising the steps of:
   (e) depositing on the wafer a layer of conductive material;
   (f) photolithographically etching the layer of conductive material to produce a plurality of pairs of parallel microstrip transducers;

(g) forming on the wafer a layer of ferrimagnetic material; and (h) photolithographically etching the ferrimagnetic layer to produce a plurality of disjoint blocks of ferrimagnetic material, each block having a pair of sides that are substantially parallel, each block being located between one of said pairs of parallel transducers and each block being oriented so that its pair of parallel sides is adjacent to and substantially parallel to the transducers between which it is located.

4. A method as in claim 3 further comprising the step of:

(i) depositing a conductive layer of material on the side of the wafer opposite to the side on which the blocks of ferrimagnetic material have been formed.

* * * * *